United States Patent [19]

So

[11] Patent Number: 5,422,287

[45] Date of Patent: Jun. 6, 1995

[54] THIN FILM TRANSISTOR AND PROCESS FOR PRODUCING THE SAME

[75] Inventor: Hoe S. So, Kyungki, Rep. of Korea

[73] Assignee: Goldstar Co., Ltd., Seoul, Rep. of Korea

[21] Appl. No.: 127,812

[22] Filed: Sep. 28, 1993

[30] Foreign Application Priority Data

Sep. 29, 1992 [KR] Rep. of Korea .............. 17811/1992

[51] Int. Cl.⁶ ................. H01L 21/302; H01L 21/3065
[52] U.S. Cl. ...................................... 437/21; 437/42; 437/41; 437/29; 437/62
[58] Field of Search ................ 437/29, 41, 62, 21

[56] References Cited

U.S. PATENT DOCUMENTS 4,104,087  8/1978  Ipri et al. .............................. 437/21
4,192,059  3/1980  Khan et al. ........................... 437/41
4,466,172  8/1984  Batra .................................... 29/571

Primary Examiner—Brian E. Hearn
Assistant Examiner—Trung Dang
Attorney, Agent, or Firm—John P. White

[57] ABSTRACT

A thin film transistor and a process for producing the same and improvements in an interfacial property between a semiconductor layer and an insulating layer and a leak current.

The thin film transistor according to the present invention consists of a semiconductor formed on an insulating substrate, a source region and a drain region formed respectively at both sides of the semiconductor layer, a field oxide film formed at side ends of the source and the drain, a gate oxide film and an oxidation protective film formed, in sequence, on the surface between the source region and the drain region, a gate arranged at a predetermined interval from the ends of the source region and the drain region on the oxidation protective film, an insulating film having contact holes for the gate, the source region and the drain region, and an electrode formed over the contact holes.

4 Claims, 5 Drawing Sheets

STEP E

STEP F

STEP G

STEP H

STEP A
prior art

STEP B
prior art

STEP C
prior art

STEP D
prior art

STEP E
prior art

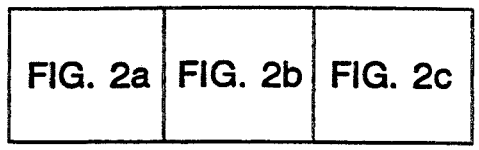
FIG. 2a
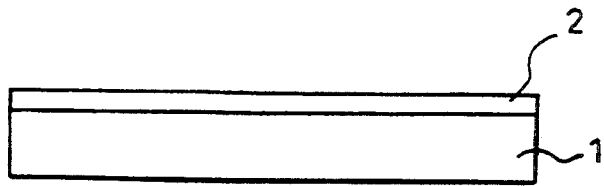
STEP A
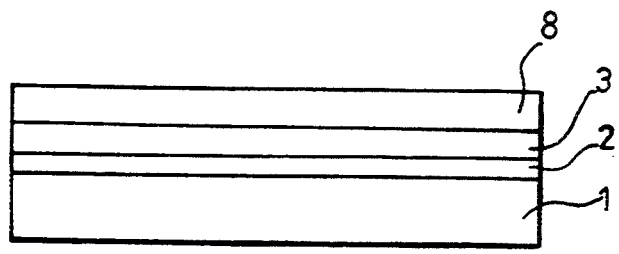
STEP B
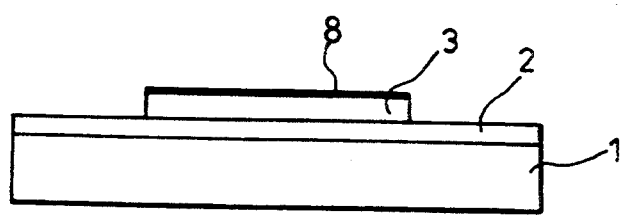
STEP C
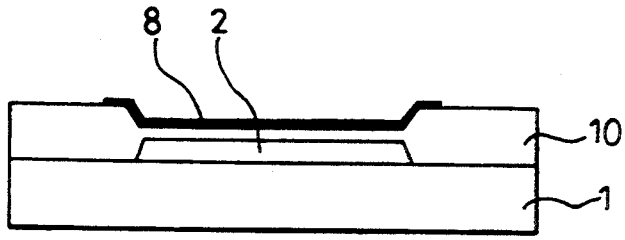
STEP D

STEP E

STEP F

STEP G

STEP H

STEP I

THIN FILM TRANSISTOR AND PROCESS FOR PRODUCING THE SAME

BACKGROUND OF THE INVENTION

1. Field of the Invention

The invention relates in general to a semiconductor element and a process for producing the same, and more particularly to improvements in an interfacial property between a semiconductor layer and an insulating layer and a leak current along with a thin film transistor and a process for producing the same.

2. Description of the Prior Art

Generally, a thin film transistor (hereinafter "TFT") for operating a liquid crystal display (hereinafter "LCD") employs amorphous silicon or polysilicon for an active semiconductor layer. Since the mobility of electrons in the amorphous silicon is very low, it is not suitable for operating an LCD which requires a high density and high definition. On the other hand, the mobility in the polysilicon is high, so that it is used as an active semiconductor in a TFT for operating an LCD.

Recently, high temperature treatment has been applied to the production of TFT to form an oxide film as well as to effect a change of the amorphous silicon into polysilicon. However, the high temperature treatment causes a leak current to increase in a manufactured TFT. In addition, there is insufficient carrier mobility in the conventional TFT.

Hereinafter, these problems will be briefly discussed for better understanding of the background of the invention. For this, a conventional process for producing a TFT and the structure of the TFT will be explained referring to FIG. 1.

As shown in step A, the conventional TFT is formed of a clean, well-dried insulating substrate 1 such as quartz. A semiconductor layer 2 of either polysilicon or amorphous silicon is deposited on the insulating substrate 1 at a thickness of approximately 1,500 Å. Thereafter, it is selectively etched by photoetching to pattern an active layer in a desired shape. Thermal oxidation process is applied to the surface of the patterned semiconductor layer to form a gate oxide film 3 which covers the semiconductor layer 2. This thermal oxidation process is conducted at a high temperature to grow the gate oxide film 3 at a thickness of approximately 500 to 1,000 Å. At this time, in the case that the amorphous silicon is employed for the semiconductor 2, it is crystallized through the thermal treatment to be ultimately transformed into polycrystalline.

Next, in step B, polysilicon doped with impurities is grown on the gate oxide film 3 at a thickness of approximately 2,000 to 5,000 Å, using a chemical vapor deposition method. Then, photoetching is undertaken to carry out removing an unnecessary part of the doped polysilicon to form a gate 4.

Subsequently, in step C, utilizing the gate 4 as a mask, a desired type impurity is ion-implanted at the dose of, for example, $1 \times 10^{13}$ to $1 \times 10^{18}/cm^2$ to form a self-aligned source region 5-1 and drain region 5-2 as shown in the figure.

Step D is undertaken to form contact holes. For this, an oxide film ($SiO_2$) 6 which acts as an insulating film is initially formed on the whole surfaces of the substrate 1 and the previously formed parts according to the regular method including CVD and is then subjected to the treatment of selective photoetching to expose a part of the gate 4 and the source region 5-1 and drain region 5-2.

Lastly, in step E, metal material such as aluminum, molybdenum/aluminum (Mo/Al) and the like is entirely deposited by sputtering. Thereafter, photoetching is carried out to form an electrode 7 which is so patterned that the metal is left over only the exposed parts of the source region 5-1, drain region 5-2 and the gate 4.

As described before, a conventional TFT comprises a substrate 1, a source region 5-1 and drain region 5-2 formed on the predetermined surface of the substrate 1, a channel region (a semiconductor layer 2 between the source region and the drain region), a gate oxide film 3 and a gate 4 formed on the channel region, an electrode 7 formed on the source region 5-1 and drain region 5-2 and on the gate 4, and an insulating film 6 formed on the entire surface except the electrode 7.

Applying electric power to the gate electrode 7 formed on the gate 4 in the conventional TFT, electrons or holes come to gather, so as to form a channel. As a result, the source region 5-1 is electrically conducted to the drain region 5-2, so that the conventional TFT comes to play the role of an operating switch for an LCD.

However, if the electrode 7 is provided with a negative voltage, most of the voltage generated between the source region 5-1 and the drain region 5-2 is concentrated on the vicinity of the drain region 5-1 and the channel. As a result, there occurs a charge pair due to charge collision and a tunneling effect in the charge trap level, so that a leak current is increased in the TFT. Consequently, the conventional TFT performs the function of an electrical switch for an LCD unsatisfactory and the conventional process for producing TFT attenuates the desirable characteristics of a semiconductor element.

SUMMARY OF THE INVENTION

For solving the above problems, the present inventors have recognized that there exits the need for a novel thin film transistor capable of performing the function of an electrical switch for an LCD completely, and for a producing process capable of providing reliability to the TFT.

Accordingly, in an aspect of the present invention, there is provided a thin film transistor capable of reducing a leak current therein.

According to another aspect of the present invention, there is provided a thin film transistor capable of increased resistance to short.

According to a further aspect of the present invention, there is provided a process for producing the thin film transistor reliably.

In accordance with the present invention, the process comprises a step of depositing a semiconductor layer on a substrate and forming a first oxide film and an oxidation protective film on an active region of the semiconductor layer, a step of subjecting an exposed semiconductor layer to thermal oxidation to form a second oxide film, a step of forming a gate on the central portion of the oxidation protective film the surface of which is then oxidized thermally to form a third oxide film thereon, a step of removing the exposed portion of the oxidation protective film and ion-implanting impurities in both sides of the semiconductor layer to form a source region and drain region by utilizing the third oxide film as a mask, a step of depositing an insulating layer and forming contact holes in the source region and drain region, and a step of depositing metal material over the contact holes to form an electrode.

The thin film transistor according to the present invention consists of a semiconductor formed on an insulating substrate, a source region and a drain region formed respectively at both sides of the semiconductor layer, a field oxide film formed at end sides of the source region and the drain region, a gate oxide film and an oxidation protective film formed, in sequence, on the surface between the source region and the drain region, a gate arranged at a predetermined interval from the ends of the source region and the drain region on the oxidation protective film, an insulating film having contact holes for the gate, the source region and the drain region, and an electrode formed over the contact holes.

Those and other objects and advantages of the present invention will become more apparent as the following description proceeds.

To the accomplishment of the foregoing and related ends, the invention, then, comprises the features hereinafter fully described in the specification and particularly pointed out in the claims, the following description and the annexed drawing setting forth in detail a certain illustrative embodiment of the invention, this being indicative, however, of but one of the various ways in which the principles of the invention may be employed.

DETAILED DESCRIPTION OF THE PREFERRED EMBODIMENTS

Figure 1:
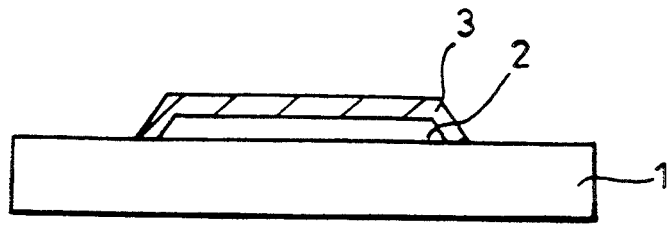
FIG. 1 is steps A-E a step diagram showing a conventional process for producing a thin film transistor.
Figure 1:
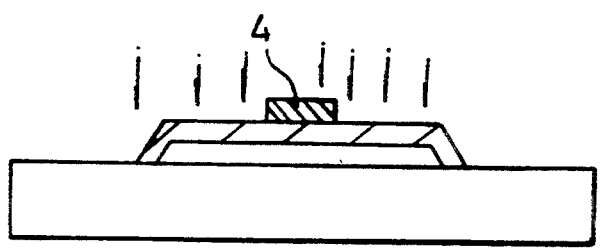
Figure 1:
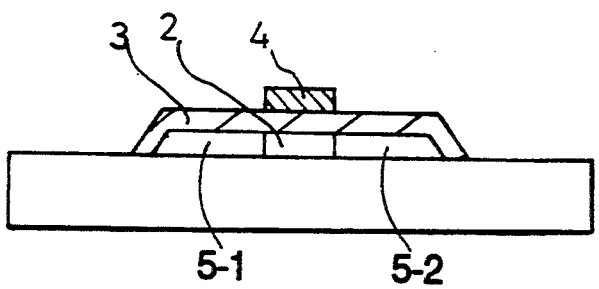
Figure 1:
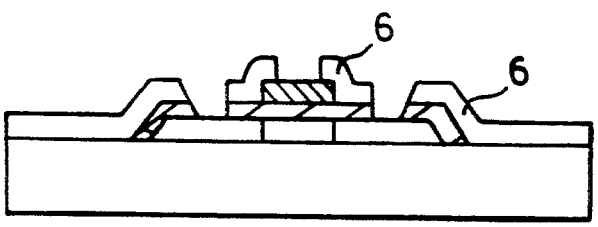
Figure 1:
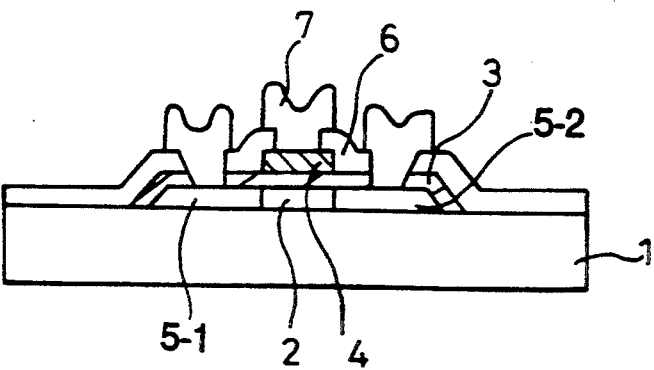
Figure 2B:
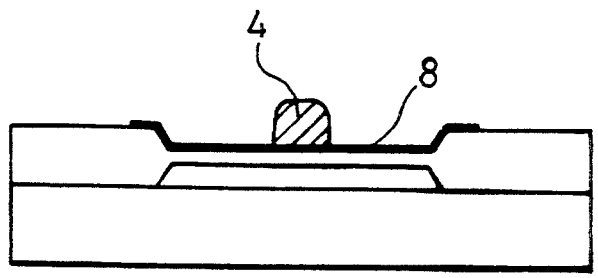
FIG. 2a steps A-D and FIG. 2b steps E-H are step diagrams showing a process for producing a thin film transistor according to the invention.
Figure 2B:
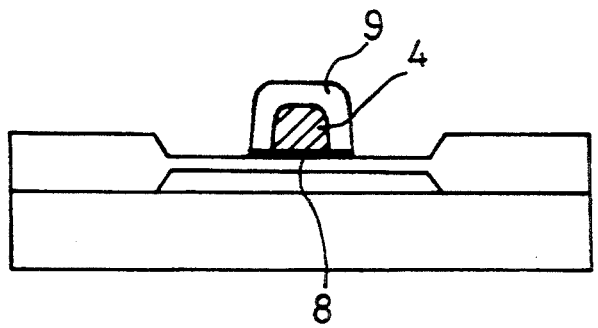
Figure 2B:
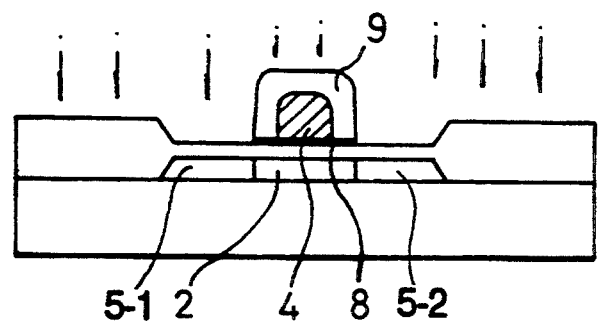
Figure 2B:
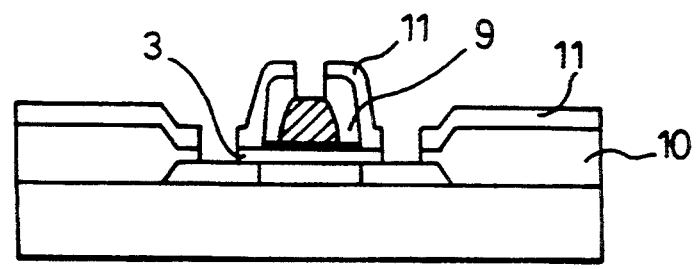
Figure 2C:
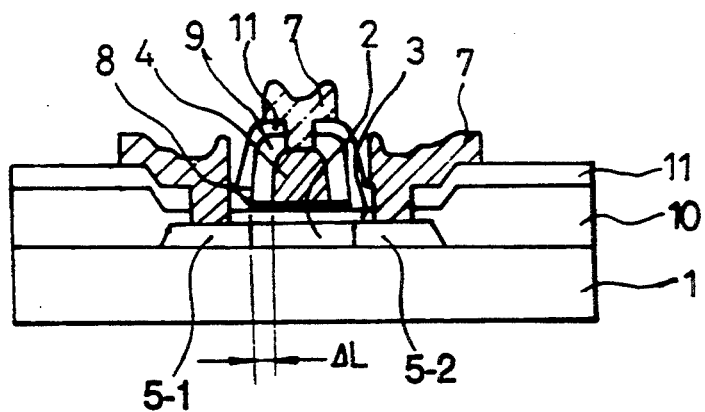

Hereinafter, preferred embodiments of the invention will be described in detail with reference to the drawings, and initially to FIG. 2, there is illustrated a process flow for a TFT in accordance with the present invention.

First, in step A, the inventive TFT is based on a clean, well-dried insulating substrate 1 such as a quartz substrate. Either polysilicon or amorphous silicon is deposited on the insulating substrate 1 in a thickness of approximately 30 to 50 nm to form a semiconductor layer 2.

Next, in step B, thermal oxidation process is applied to the semiconductor layer 2 to grow a first oxide film 3 at a thickness of approximately 400 to 1,500 Å, on which silicon nitride ($Si_3N_4$) or the like is subsequently deposited to form an oxidation protective film 8, using a chemical vapor deposition method.

Step C is undertaken to carry out removing a part of the first oxide film 3 and the oxidation protective film 8, so that their remnant (necessary) part exists in only an active region wherein a gate and a source region and drain region are to be formed.

Subsequently, in step D, the semiconductor layer 2 is subjected to the treatment of thermal oxidation to form a second oxide film 10, using the oxidation protective film 8 as a mask. This thermal process is conducted at a high temperature. At this time, the exposed part of the semiconductor is thermally oxidized whereas the oxidation protective film-forming part is not oxidized.

Step E is undertaken to form a gate 4. For this, there is entirely deposited a semiconductor layer doped with impurity, which is then removed selectively, using a photoetching method.

In step F, a third thermal oxidation process is carried out at a temperature of 800° to 1,100° C. to form a third oxide film 9 on the exposed surface of the gate 4 and to selectively remove the exposed surface of the oxidation protective film 8. It should be noted that the first oxide film 3 and the second oxide film 10 my likewise be applied by a thermal oxidation process at a temperature of 800° to 1,100° C.

As illustrated in step G, a desired type impurity is ion-implanted in the semiconductor layer 2 to form a source region 5-1 and a drain region 5-2, utilizing the third oxide film 9 and the gate 4 as a mask. If an N type TFT were to be produced, impurity such as phosphorous (P), Arsenic (As), Antimony (Sb) and the like might be ion-implanted. On the other hand, if a P type TFT were to be produced, impurity such as boron (B), gallium (Ga) and the like might be ion-implanted. The source region 5-1 and the drain region 5-2 are made in spaced relation from each other at both side ends of the semiconductor layer 2 so as to develop a channel region in the layer 2. In addition, each of the two regions 5-1 and 5-2 is set at a distance of $\Delta L$, which is the thickness of the third oxide film 9, owing to using the third film 9 as a mask. This distance makes it possible to reduce the leak current caused in a conventional thin film transistor.

Subsequently, in step H, an insulating film 11 is deposited over all of the other layers. Thereafter, the source region 5-1 and drain region 5-2, the insulating film 11 on the surface of the gate 4, the first film 3, and the third oxide films 9 are selectively etched to form contact holes.

Lastly in step I, metal such as aluminum (Al), or metal alloy such as molybdenum/aluminum (Mo/Al), tungsten/aluminum (W/Al) and the like is deposited by sputtering. Thereafter, photolithography and etching are carried out to selectively remove the unnecessary parts of the metal layer, so as to form an electrode 7.

Figure 3:
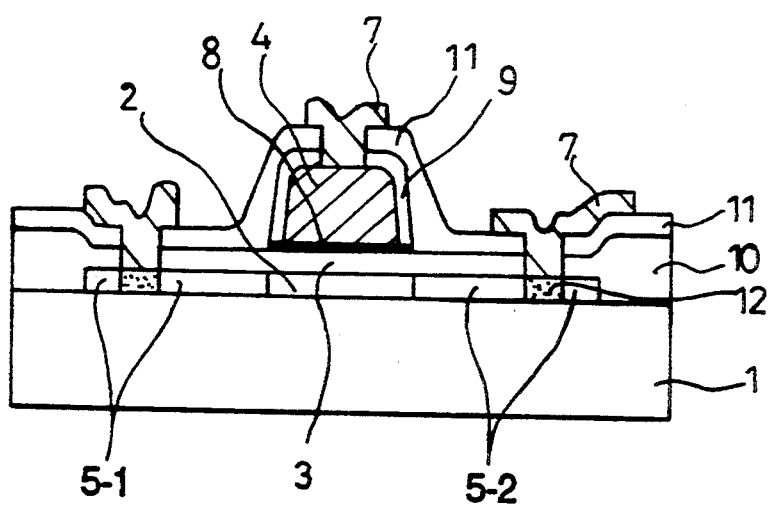
FIG. 3 is a schematic section view showing a thin film transistor according to another embodiment of the invention.

Turning now of FIG. 3, there is schematically shown another embodiment of the present invention. This embodiment is produced by applying a further ion-implantation step to the process for producing the embodiment of FIG. 2. In detail, following the deposition of the insulating film 11 on the source region 5-1 and drain region 5-2 which is formed as mentioned above, contact holes are formed in the source region 5-1 and drain region 5-2 to expose the source region 5-1 and drain region 5-2, in which ion implantation is then carried out. As a result, a highly doped semiconductor layer 12 is formed. Thereafter, the electrode 7 is formed.

Accordingly, the TFT, as illustrated hereinbefore, comprises a semiconductor layer 2 on an insulating substrate 1, source region 5-1 and drain region 5-2 formed in spaced relation from each other at both the end sides of the semiconductor layer 2 so as to develop a channel, a field oxide film 10 formed at the side ends of the source region 5-1 and the drain region 5-2, a gate oxide film 3 having contact holes for the source region 5-1 and drain region 5-2 formed over the semiconductor layer 2, an oxidation protective film 8 formed on the surface of the gate oxide film 3 over the channel, a gate 4 formed on the oxidation protective film 8 being arranged in a horizontal direction at an interval of ΔL from the ends of the source region 5-1 and the drain region 5-2, an oxide film 9 having a contact hole formed on the surface of the gate 4, an insulating film having contact holes for the source region 5-1, and the drain region 5-2 and the gate 4, and an electrode 7 over the contact holes.

The inventive TFT is not less workable than the aforementioned, conventional transistor.

As explained before, in the TFT according to the present invention, the gate is in spaced relation from the source region and the drain region, so that there may be a reduced leak current caused by employing a high temperature in producing a polycrystalline TFT. Hence, the inventive TFT, when applied to the picture element of an LCD, secures the function of an electrical switching element. In addition, since the silicon nitride ($Si_3N_4$) film, which has a large dielectric constant, is utilized as a part of a gate insulating film in the TFT according to the present invention, there may be prevented the formation of pin holes between the gate electrode and the active semiconductor layer as well as may be obtained a relatively large electric current conducted therebetween.

Furthermore, thermal oxidation is applied to all parts except for the active region of the semiconductor layer to form oxide films thereon, so that the steps generated on the outskirts of the active region comes to be reduced. In succession, the reduction effects the prevention of a short in a signal electrode line.

What is claimed is:

1. A process for producing a thin film transistor, which comprises the steps of:
    depositing a semiconductor layer on a substrate and forming a first oxide film and an oxidation protective film;
    removing the first oxide film and the oxidation protective film selectively so as to leave these films on only an active region and oxidizing the exposed surface of the semiconductor layer to form a second oxide film;
    patterning a gate on the oxidation protective film and subjecting the gate surface to the treatment of thermal oxidation to form a third oxide film thereon;
    removing the exposed portion of the oxidation protective film and carrying out ion-implantation of impurities into the semiconductor layer to form a source region and a drain region;
    depositing an insulating film on the first oxide film, the second oxide film, and the third oxide film and forming contact holes therein adjacent the gate, the source region, and the drain region; and
    depositing metal material over the contact holes to form an electrode.

2. A process according to claim 1, in which the oxidation protective film is a silicon nitride ($Si_3N_4$) film.

3. A process according to claim 1, in which the first film, the second film and the third oxide film are formed through the treatment of thermal oxidation at a temperature of 800° to 1,100° C.

4. A process according to claim 1, which further comprises carrying out ion implantation at a high impurity density in the source region and the drain following the formation of contact holes therein.

* * * * *